United States Patent [19]

Blumenkranz et al.

[11] Patent Number: 4,694,258

[45] Date of Patent: Sep. 15, 1987

[54] METHOD AND SYSTEM OF ENHANCING PERFORMANCE OF FEEDFORWARD AMPLIFIERS

[75] Inventors: Robert M. Blumenkranz, Brea; Mark A. Gibbons, Anaheim, both of Calif.

[73] Assignee: General Instrument Corporation, New York, N.Y.

[21] Appl. No.: 840,428

[22] Filed: Mar. 14, 1986

[51] Int. Cl.⁴ ............................................. H03F 1/32
[52] U.S. Cl. ........................................ 330/2; 330/151
[58] Field of Search ..................... 330/2, 52, 149, 151; 324/73 R

[56] References Cited

U.S. PATENT DOCUMENTS 4,472,725  9/1984  Blumenkranz .................. 330/151 X Primary Examiner—James B. Mullins
Attorney, Agent, or Firm—Spensley Horn Jubas & Lubitz

[57] ABSTRACT

A method and system for enhancing the performance of feedforward amplifiers includes the provision of multiple sweep displays, one each for providing a display of a single performance characteristic of the amplifier. Various characteristics are monitored on an alternating and interleaved basis, and displayed during the intervals that they are monitored. The monitoring intervals are short enough so that each display appears to be continuous. The performance characteristics of the amplifier are thus observable on a real time basis, thereby facilitating adjustment of the amplifier to achieve optimum overall operation.

17 Claims, 6 Drawing Figures

RESPONSE AND OUTPUT NULL PATTERN

INPUT RETURN LOSS AND INPUT NULL PATTERN

OUTPUT RETURN LOSS

METHOD AND SYSTEM OF ENHANCING PERFORMANCE OF FEEDFORWARD AMPLIFIERS

BACKGROUND OF THE INVENTION

1. Field of the Invention

The present invention relates to feedforward amplifiers and more particularly to a method and system for aiding in the alignment procedure of feedforward amplifiers to achieve optimum performance.

In cable communication systems it is often necessary to transmit signals long distances over coaxial cables. The strength of the transmitted signals decreases in proportion to the length of the cable over which the signals are transmitted, necessitating amplification of the signals at repeated intervals along the cable to maintain adequate signal strength. The electronic amplifiers used to amplify the signals inherently distort the signal as they amplify it. Ideally, such distortion is to be eliminated or reduced to some acceptable minimum level.

Feedforward amplifiers are able to provide relatively distortion-free amplification by extracting from the amplified signal a signal component representative of the distortion introduced by the amplifier, phase inverting that component, and then recombining the phase inverted distortion component with the amplified signal. The phase inverted distortion component cancels the distortion component in the amplified signal, leaving a relatively distortion-free amplified signal for transmission along the cable. To avoid further distortion, the signals must coincide precisely in time when they are recombined. To ensure such coincidence, delay means are provided to delay the signals and thereby compensate for time delays which arise when the signals pass through the various electronic components in the amplifier. A particular feedforward amplifier is described in U.S. Pat. No. 4,472,725 to Robert M. Blumenkranz, an inventor of the present invention.

2. Description of the Prior Art

The alignment of feedforward amplifiers requires precise component matching and circuit balancing which can often take hours to accomplish. Various components such as capacitors and directional couplers must be adjusted to achieve the maximum performance from the amplifier. Typically, the adjustment procedure is accomplished by applying test signals to the amplifier in the form of an RF (radio frequency) sweep signal and viewing the amplifier response to the signal on an RF analyzer which includes a sweep display. Various components of the amplifier are adjusted while viewing the display in order to achieve optimum performance. For example, in the above-mentioned U.S. Pat. No. 4,472,725, a tuning procedure is described in which two different performance parameters are simultaneously displayed while making adjustments to the amplifier.

The difficulty in aligning feedforward amplifiers comes from the fact that the adjustment of various components can affect several different operational characteristics. Thus, by aligning the various components for optimum performance for a certain characteristic, other operational characteristics of the amplifier may be adversely affected. The testing of several of the performance characteristics is mutually exclusive, i.e., the test configuration is such that no additional tests can be simultaneously performed. As a result, the prior art alignment procedure involves performing adjustments while viewing displays of one or two operational characteristics, reconfiguring the test set up to display different operational characteristics and performing further alignment while viewing the displays of the additional operational characteristics. However, since each adjustment may affect many operational characteristics, watching displays of only one or two characteristics does not enable the technician to optimally adjust the amplifier.

SUMMARY OF THE INVENTION

The present invention is directed to a system which enables all of the important performance characteristics of a feedforward amplifier to be displayed on a real-time basis. The technician can therefore monitor the effects of any adjustment on the overall performance of the amplifier, not just one or two parameters. The present invention enables the technician to simultaneously view displays of the overall frequency response of the amplifier, the input return loss and output return loss of the amplifier, and the input loop null response and output loop null response of the amplifier. By simultaneously viewing these interrelated parameters, the technician may adjust the amplifier to achieve overall optimum performance.

In the present invention, plural repeating test intervals are provided to facilitate the testing of all necessary performance characteristics. Each interval is very short and the intervals are repeated at a high rate. During a first interval, the system is arranged in a first configuration and a first RF sweep signal is applied to the amplifier. One or more response characteristics of the amplifier are displayed. These displays are then blanked and the test system is reconfigured during a second sweep interval to apply a new RF sweep signal and monitor different performance characteristics of the amplifier. These response characteristics are displayed on additional displays. If necessary, one or more additional intervals may be provided to test further performance characteristics.

Each response characteristic is displayed only during the interval during which the test system is configured to provide an output of that response characteristic. Each display is therefore active during only one interval. However, the intervals are short enough such that the display appears to be continuous to the technician. Thus, all of the important performance characteristics may be simultaneously viewed, thereby enabling the effect of any adjustment with respect to the overall performance of the amplifier to be monitored.

BRIEF DESCRIPTION OF THE DRAWINGS

The invention will be described with reference to the accompanying drawings, wherein:

FIG. 3 is a table indicating the configuration of the system during different sweep intervals.

DESCRIPTION OF THE PREFERRED EMBODIMENT

The following description is of the best presently contemplated mode of carrying out the invention. This description is for the purpose of illustrating the general principles of the invention and is not to be taken in a limiting sense. The scope of the invention is best determined by reference to the accompanying claims.

Figure 1:
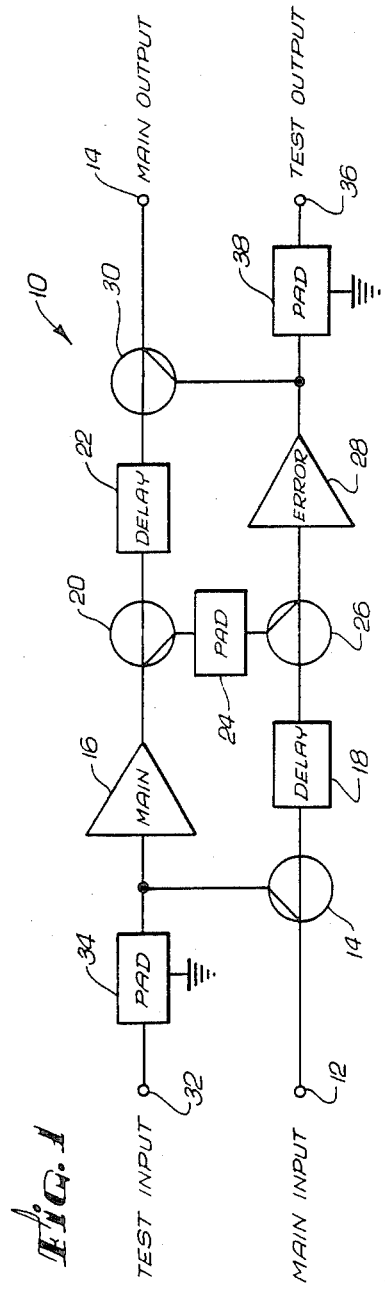
FIG. 1 is a schematic diagram of a feed forward amplifier.

Referring to FIG. 1, amplifier 10 includes a main input 12 and a main output 14. An RF input signal is applied to the main input 12 and divided by means of a directional coupler 14. The directional coupler splits the input signal into two portions, one of which is delivered to the input terminal of a main amplifier 16 and the other of which is delivered to a delay means 18. The portion of the signal delivered to the main amplifier 16 is inverted in phase by the coupler 14 with respect to that portion of the signal sent to the delay means 18.

The amplified output of the main amplifier 16, which includes a distortion component, is applied to a second directional coupler 20 which splits the amplified signal into two portions, one of which is directed to a second delay means 22 and the other of which is directed to an attenuator or pad 24. Attenuator 24 is adjusted to attenuate signals passing through it by an amount which is inversely proportional to the gain of the main amplifier 16. This attenuated signal portion is coupled to a third directional coupler 26 which combines it with the non-amplified signal portion passed through the first delay means 18.

First delay means 18 is included to ensure that the non-amplified signal portion reaching the third directional coupler 26 will coincide precisely in time with the attenuated signal portion passed to the third directional coupler 26 by the attenuator 24. If these signals do not coincide precisely in time then undesirable distortion results when they are combined.

Because the attenuated signal portion is 180° out of phase with respect to the non-amplified signal portion from the delay means 18, signals in the two portions representative of the initial input signal cancel one another, so that the signal leaving the third directional coupler 26 represents only the distortion introduced by the amplifier 16. This signal is applied to an error amplifier 28 which has a gain equal to that of the main amplifier. The output of the error amplifier thus corresponds to the distortion component of the output of the main amplifier 16, but is reversed in phase. This output is combined with the delayed output of the main amplifier 16 at a fourth directional coupler 30. The output of the error amplifier thus cancels the distortion component of the output of the main amplifier 16, leaving an undistorted signal at the main output 14 of the amplifier.

The amplifier illustrated in FIG. 1 also includes a test input 32 coupled to the main amplifier 16 by means of a pad 34 and a test output 36 coupled to the output of the error amplifier 28 by means of a pad 38. These terminals of the amplifier are employed for the testing of various operational characteristics to be described subsequently.

Figure 2:
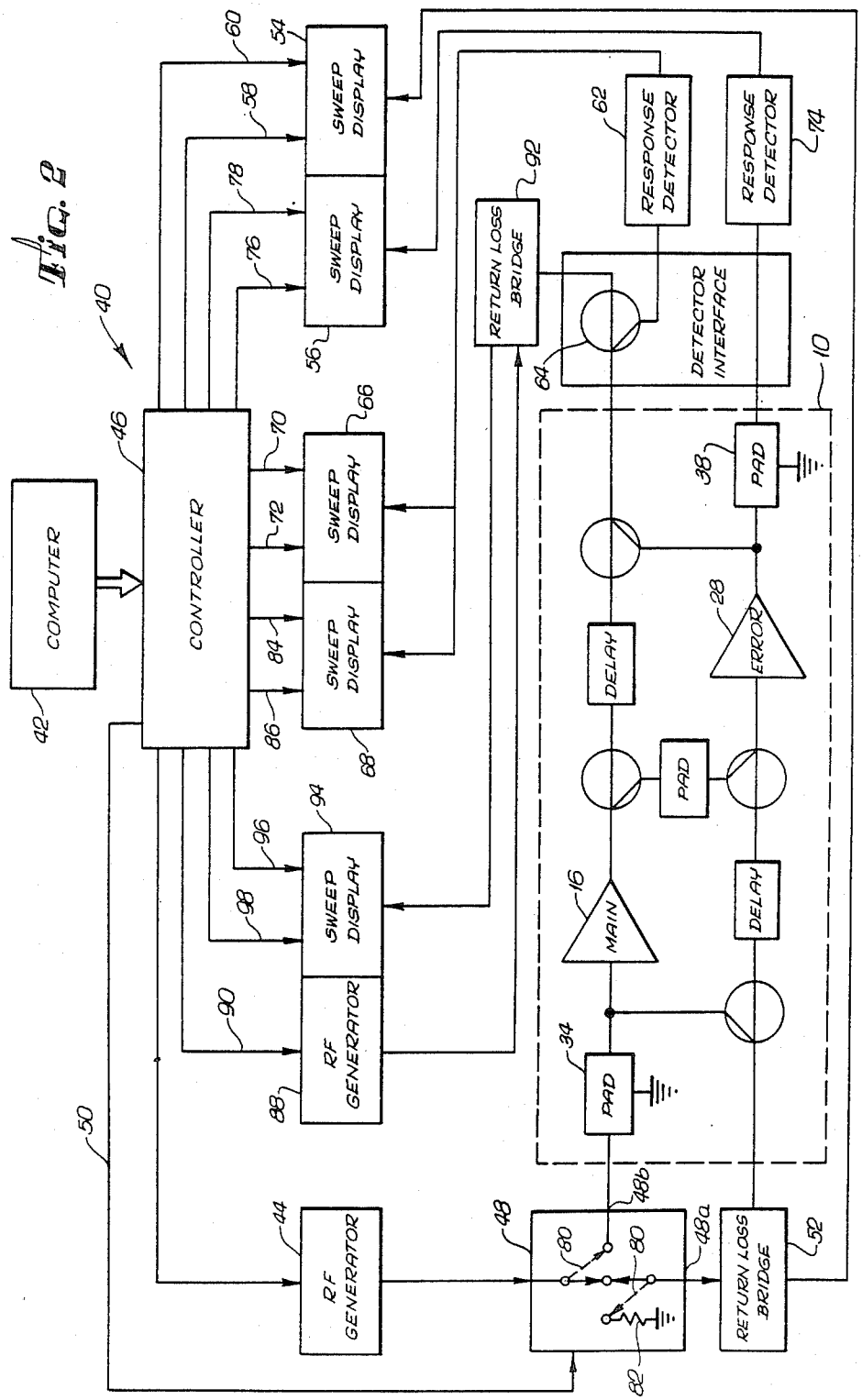
FIG. 2 is a block diagram of the system of the present invention.

FIG. 2 shows an amplifier 10 connected to a response display system 40 of the present invention. Basically, the system operates under control of a computer 42 to display different performance characteristics of the amplifier 10 on an alternating basis. A separate display is provided for each performance characteristic to be monitored, and the rate of monitoring is such that each display will appear to be continuous. The technician adjusting the amplifier 10 can therefore observe all of the performance related parameters simultaneously.

Various response characteristics of the amplifier 10 are mutually exclusive, i.e., they cannot be tested at the same time and attempts to do so will result in interference. The system of the present invention controls the application of various test signals and the monitoring of the response of the amplifier to avoid any such interference.

Three important operational characteristics of a feedforward amplifier are its main frequency response, its input return loss and its input (or first) loop null response. These parameters may be monitored simultaneously without interference. Therefore, they are all monitored by applying an RF sweep signal to the amplifier during a first sweep interval as indicated at FIG. 3. During this sweep interval, an RF generator 44 generates a constant peak amplitude RF single sweep signal of fixed duration which sweeps from approximately 50 mHz to 600 mHz. This signal is of a fixed sweep duration and triggered by means of a controller 46 which, under control of the computer 42, provides all of the necessary signals to control the timing of different functions performed by the system. The controller is comprised of suitable logic circuitry to provide control signals to operate the system. Many different logic configurations could be employed, and the details of the controller will therefore not be discussed.

The output of the RF generator 44 is applied to a fast switching pin diode switch 48, the switching of which is controlled by the controller 46 along line 50. During the first sweep interval, the switch is configured as shown in FIG. 2, i.e., so that the input is passed to an output 48a. The RF sweep signal is applied to the main input of the amplifier 10 via a return loss bridge 52. The return loss bridge 52 is used to monitor the input return loss of the amplifier. The return loss is displayed on an RF analyzer such as, for example, a model 560A marketed by Wiltron Co. This particular analyzer includes dual displays 54 and 56 which are independently controllable, with the display 54 being used to monitor the input return loss characteristics of the amplifier 10. During the first sweep interval, the display is swept in response to a control signal from the controller 46 on line 58. The sweep is synchronized with the sweep period of the RF generator 44. At times other than the first interval, the display 54 is blanked by means of a blanking signal provided on line 60.

The main frequency response of the amplifier may be simultaneously monitored with the input return loss. A response detector 62 is coupled to the main output of the amplifier via a detector interface which includes a directional coupler 64. The output of the response detector is applied to a display 66 of a second RF analyzer. This analyzer includes a second independent display 68. The display 66 is swept during the first sweep interval in response to a control signal on line 70 and is blanked at all other times in response to a blanking signal on line 72.

In addition to the main response and input return loss of the amplifier, the input loop (first loop) null response may also be monitored during the first sweep interval. This response is the response of the error amplifier of the feedforward amplifier block. To monitor this response, a response detector 74 is connected to receive the output of the error amplifier 28 via the pad 38. The response is displayed on the display 56 which is swept by means of a control signal on line 76 in synchronization with the sweep of the RF generator 44 and blanked at times other than the first sweep interval by means of a control signal on line 78.

Thus, the main response, input return loss and input loop null response of the amplifier may be simultaneously monitored. However, several other response parameters require different test configurations to enable them to be monitored. The present invention therefore provides additional sweep intervals. During a second sweep interval, as indicated in FIG. 3, the output loop (second loop) null of the amplifier is monitored. In order to monitor this characteristic of the amplifier, a sweep signal is applied directly to the main amplifier 16 and the main output is monitored by means of the response detector 62. In order to apply a sweep signal directly to the main amplifier 16, the switch 48 is switched to the configuration shown by dashed arrows 80. In this configuration, the main input of the amplifier is terminated by a 75 ohm resistor 82 and the output of the RF generator 44 is applied to the main amplifier 16 via the pad 34. The response during this interval is displayed by the display 68 which is swept in synchronization with the RF generator 44 by means of a control signal provided on line 84 and blanked during times other than the second interval by means of a control signal on line 86.

An additional operational characteristic which is to be monitored is the output return loss of the amplifier. The monitoring of this characteristic would interfere with the monitoring of the previously described characteristics and is thus accomplished during a third sweep interval. During this interval, the switch 48 remains in the configuration it had during the second test interval. A second RF generator 88 is triggered by means of a control signal on line 90 to provide a sweep signal to the main output terminal of the amplifier via a return loss bridge 92 and the directional coupler 64. The output return loss of the amplifier is detected by the bridge 92 and displayed on a display 94, which is swept during the third interval by means of a control signal on line 96 and blanked during the first two intervals by means of a control signal on line 98.

It should be noted that the directional coupler 64 is provided to split the output signal to enable both return loss and response detection. Alternatively, a switch such as that provided at the input could be employed to switch the output to the different detectors.

In the present embodiment of the invention RF generator 88 and display 94 are both part of a single display RF analyzer, such as, for example, a model 640 marketed by the Wiltron Co. Of course, an independent RF generator and display could be employed. In addition, instead of using the single RF generator 44 in conjunction with the switch 48, separate RF generators could be provided to provide the sweep signals at the inputs of the amplifier. The configuration of the various components of FIG. 2 during the sweep intervals is listed in FIG. 3. The computer 42 is programmed to control the controller 46 to provide the necessary control signals to activate the various components in the proper order to avoid interference in the monitoring of different response characteristics.

Figure 4:
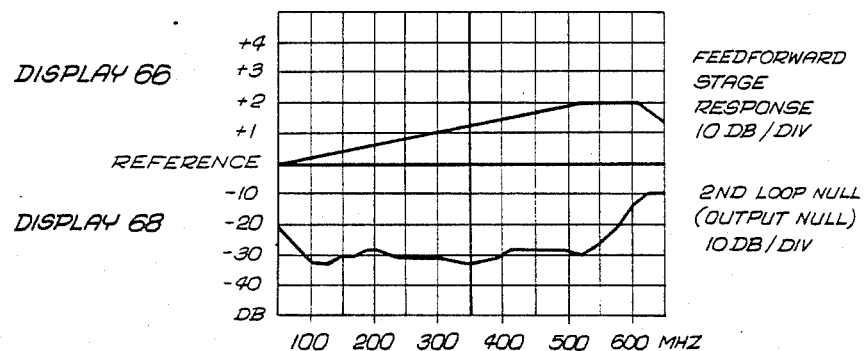
FIGS. 4-6 are graphs of various response characteristics monitored by the system.
Figure 5:
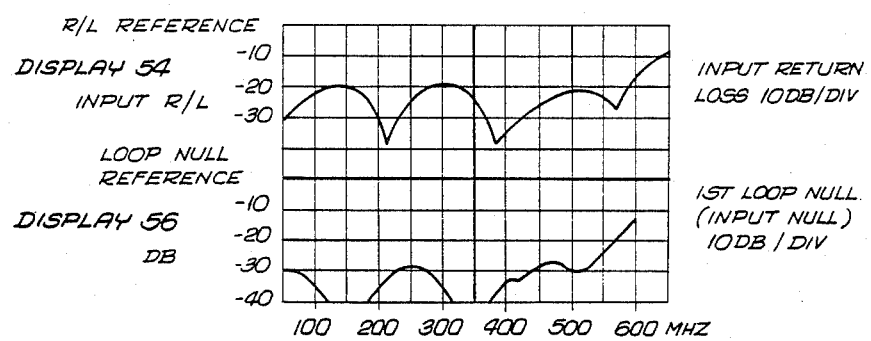
Figure 6:
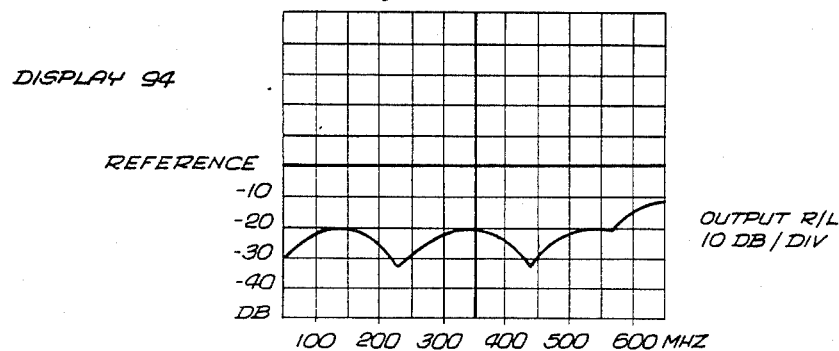

The system of the present invention operates to sequentially repeat the three sweep intervals at a rapid rate. The sweep intervals are short enough so that the display of each operational characteristic of the amplifier will appear to be continuous. The technician is thus provided with a real-time display of each of five different operational characteristics of the amplifier, even though the characteristics cannot be simultaneously monitored. It is possible to observe the total performance related parameters which describe the feed forward stage as a finished product. The response characteristics observable on the displays are illustrated in FIGS. 4-6. During alignment, the technician may retune variable components of the amplifier, reposition wires of the directional couplers and/or add additional reactive elements in order to optimize the circuit parameters. The alignment process is carried out while viewing all of the displays, and it is thus possible to determine the effect of any adjustment on the overall performance of the amplifier.

By using the alignment procedure in which all five displays are continuously viewable, the optimum compromise between null pattern response, usable band width, input and output match and frequency response may be achieved. After gaining familiarity with the system, the technician's pattern recognition will be coordinated with the physical adjustments which give the ability to tune each parameter effectively and efficiently. With particular amplifier with which the alignment procedure is performed, it has been possible to extend the usable bandwidth of the amplifier from 350 mHz to 450 mHz while maintaining the remaining parameters at required levels. A significantly enhanced product is therefore obtained with the addition of little or no circuitry simply by properly positioning and adjusting components of the amplifier.

What is claimed is:

1. A method of enhancing the performance of a feed forward amplifier which includes operational characteristics of frequency response, input return loss, output return loss, input loop null response and output loop null reponse, comprising the steps of:

monitoring each of said operational characteristics on a repeating and alternating basis;

independently displaying each monitored characteristic on a real-time basis such that all of said characteristics may be viewed together; and adjusting components of the amplifier while viewing the displayed characteristics to achieve a desired combination of the displayed characteristics.

2. A method as in claim 1 wherein the step of monitoring includes the steps of:

applying an RF sweep signal to the amplifier during at least first and second alternating and repeating sweep intervals;

monitoring each of said operational characteristics during one of the sweep intervals, wherein each sweep interval is repeated at a rate sufficient for the displays to appear substantially continuous.

3. A method as in claim 2 wherein there are first, second and third sweep intervals, the method further including the steps of:

monitoring the frequency response, input return loss and input loop null response during the first sweep interval;

monitoring the output loop response during the second sweep interval;

monitoring the output return loss during the third sweep interval; and displaying each characteristic during the sweep interval in which it is monitored.

4. A method as in claim 3 wherein the step of applying an RF sweep signal includes applying a first RF sweep signal to a main input of the amplifier during the first sweep interval, applying a second RF sweep signal to a test input of the amplifier separate from the main input during the second sweep interval, and applying a third RF sweep signal to a main output of the amplifier during the third sweep interval.

5. A method of facilitating the tuning of a feedforward amplifier comprising the steps of:
dividing a real-time viewing period into a plurality of sweep intervals, each interval being sufficiently long to sweep an RF signal generator through a predetermined set of frequencies;
applying a first radio frequency sweep signal to the amplifier during a first sweep interval;
detecting and displaying the frequency response, input return loss and input loop null response of the amplifier on first, second and third displays, respectively, during the first sweep interval;
applying a second radio frequency sweep signal to the amplifier during a second sweep interval;
detecting and displaying the output loop null response of the amplifier on a fourth display during the second sweep interval;
applying a third radio frequency sweep signal to the amplifier during a third sweep interval;
detecting and displaying the output return loss of the amplifier on a fifth display during the third sweep interval; and
regularly repeating the first, second and third intervals to provide a real-time multiplexed display of the frequency response, input return loss, input loop null response, output loop null response and output return loss of the amplifier, such that the amplifier may be adjusted interactively for a desired set of performance characteristics by monitoring all of the displays.

6. A method of improving the performance of a feedforward amplifier including (a) a main amplifier for producing a first output signal, (b) an error amplifier for producing a second output signal, (c) first and second delay means, (d) a first directional coupler for splitting an input RF signal and for directing portions of said signal to the input of said main amplifier and to the input of said first delay means, (e) a second directional coupler for splitting said first output signal and for directing portions of said first output signal to the input of said second delay means and to a third directional coupler, (f) a third directional coupler for combining the portion of said first output signal received from said second directional coupler with an output signal from said first delay means and for directing the combined signals to the input of said error amplifier, and (g) a fourth directional coupler for combining an output signal from said second delay means with said second output signal and for directing the combined signals to an output port, the method including the steps of:
dividing a real-time viewing period into a plurality of sweep intervals, each interval being sufficiently long to sweep an RF signal generator through a predetermined set of frequencies;
applying a first RF sweep signal to the first directional coupler during a first sweep interval;
applying a second RF sweep signal to the main amplifier during a second sweep interval;
applying a third RF sweep signal to the output port during a third sweep interval;
continuously repeating the first, second and third sweep intervals;
detecting and displaying the frequency response, input return loss and input loop null response characteristics of the amplifier during each first sweep interval, the output loop null response characteristics of the amplifier during each second sweep interval and the output return loss characteristics of the amplifier during each third sweep interval, wherein the sweep intervals are repeated at a rate sufficient so that the displays appear substantially continuous, thereby providing a real-time multiplexed display of the amplifier characteristics; and
adjusting the operation of the amplifier while monitoring the displays to achieve a desired combination of all of the monitored characteristics.

7. A system for use in enhancing the performance of a feed forward amplifier comprising:
generator means for providing RF sweep signals;
first control means for selectively and repetitively applying the RF sweep signals to the amplifier;
monitoring means for monitoring the frequency response, input return loss, output return loss, input loop null response and output loop null response characteristics of the amplifier in response to the RF sweep signals;
first display means for displaying the frequency response characteristics of the amplifier;
second display means for displaying the input return loss characteristics of the amplifier;
third display means for displaying the output return loss characteristics of the amplifier;
fourth display means for displaying the input loop null response characteristics of the amplifier;
fifth display means for displaying the output loop null response characteristics of the amplifier; and
second control means for causing each of the display means to display its monitored characteristic on a real time multiplexed basis such that all of said characteristics may be monitored simultaneously, thereby facilitating adjustments to the amplifier to achieve desired values for all of said monitored characteristics.

8. A system as in claim 7 wherein:
the first control means includes switching means for causing (a) a first RF sweep signal to be applied to the amplifier during a repetitive first sweep interval, (b) a second RF sweep signal to be applied to the amplifier during a repetitive second sweep interval and (c) a third RF sweep signal to be applied to the amplifier during a third repetitive sweep interval, wherein said sweep intervals alternate with each other; and
the second control means includes switching means for enabling the display of each monitored characteristic during only one of the sweep intervals, wherein at least one characteristic is displayed during each of the sweep intervals.

9. A system as in claim 8 wherein the switching means of the second control means includes means for enabling the display of (a) the frequency response, input return loss and input loop null characteristics during each first sweep interval, (b) the output loop response characteristic during each swecond sweep interval, and (c) the output return loss characteristic during each third sweep interval.

10. A system as in claim 9 wherein the switching means of the first control means includes means for applying (a) the first RF sweep signal to the main input of the amplifier, (b) the second RF sweep signal to an input separate from the main input of the amplifier, and (b) the third RF sweep signal to the main output of the amplifier.

11. A system as in claim 10 wherein the generator means includes a first RF generator for generating the first and second sweep signals and a second RF generator for generating the third sweep signal, the first control means further including RF switch means for receiving the output of the first RF generator and coupling it to the main amplifier input during the first sweep interval and to the separate input during the second sweep interval 12. A system as in claim 11 including termination means for terminating the main input in the amplifier with a predetermined impedance when the RF generator is coupled to the separate input.

13. A system as in claim 11 wherein the first control means includes means for causing the first RF generator to generate sweep signals only during the first and second sweep intervals and the second RF generator to generate sweep signals only during the third sweep interval.

14. A system as in claim 7 wherein the monitoring means includes a first return loss bridge for connection to the main input of the amplifier, a second return loss bridge for coupling to the main output of the amplifier, a first RF response detector for coupling to the main output of the amplifier and a second RF response detector for coupling to an output separate from the main output of the amplifier.

15. A system for observing the effects of an adjustment made to a feedforward amplifier on a real-time interactive basis; the effects including alterations to the: (a) input return loss, (b) input loop null, (c) output loop null, (d) output return loss and (e) main frequency response characteristics of the feedforward amplifier; comprising:

a multiplexing control means for dividing a real-time viewing period into a plurality of test intervals and generating control signals for said test intervals;

a reconfigurable test circuit means for connectively applying test signals to the feedforward amplifier and for testing all of said feedforward amplifier characteristics within the real-time viewing period, the test circuit means including a circuit switching means for reconfiguring test circuit connections to the feedforward amplifier between test intervals in response to the control signals from the control means so that mutually exclusive ones of said characteristics may be tested during the viewing period; and display means, coupled to said test circuit means, for displaying all of said characteristics during the real-time viewing period, thereby enabling simultaneous monitoring of said characteristics when an adjustment is made to the feedforward amplifier.

16. The system of claim 15 wherein the reconfigurable test circuit means is switchable into first, second and third configurations;

the first configuration being for testing the main frequency response, input return loss and input loop null characteristics of the feedforward amplifier;

the second configuration being for testing the output loop characteristic of the feedforward amplifier; and the third configuration being for testing the output return loss characteristic of the feedforward amplifier.

17. The system of claim 15 wherein the circuit switching means includes a PIN diode switch.

* * * * *